(12) United States Patent
Sekine et al.

(10) Patent No.: US 8,519,457 B2
(45) Date of Patent: Aug. 27, 2013

(54) SOLID-STATE IMAGE PICKUP DEVICE AND A CAMERA MODULE

(75) Inventors: Hirokazu Sekine, Fujisawa (JP); Masanori Ashino, Kitakami (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 129 days.

(21) Appl. No.: 13/116,158

(22) Filed: May 26, 2011

(65) Prior Publication Data

US 2011/0221956 A1 Sep. 15, 2011

Related U.S. Application Data

(62) Division of application No. 11/697,451, filed on Apr. 6, 2007, now abandoned.

(30) Foreign Application Priority Data

Apr. 7, 2006 (JP) .................................. 2006-106246

(51) Int. Cl.
*H01L 31/062* (2012.01)
*H01L 31/113* (2006.01)
*H01L 29/00* (2006.01)
*H01L 23/04* (2006.01)

(52) U.S. Cl.
USPC ..... 257/292; 257/528; 257/698; 257/E27.133

(58) Field of Classification Search
USPC ................ 257/292, 433, 528, 532, 536, 690, 257/698, 777, E27.133, E27.144
See application file for complete search history.

(56) References Cited

U.S. PATENT DOCUMENTS

| 6,613,690 | B1 * | 9/2003 | Chang et al. .................. 438/712 |
| 7,105,904 | B2 | 9/2006 | Choi |
| 7,265,916 | B2 | 9/2007 | Kimura |
| 7,368,795 | B2 | 5/2008 | Hsin |
| 2002/0134581 | A1 | 9/2002 | Figueroa et al. |
| 2003/0098505 | A1 | 5/2003 | Kimura et al. |

(Continued)

FOREIGN PATENT DOCUMENTS

| CN | 2590180 Y | 12/2003 |
| CN | 1648707 A | 8/2005 |

(Continued)

OTHER PUBLICATIONS

Office Action issued Aug. 24, 2010 in Japan Application No. 2006-106246 (w/partial English translation).

(Continued)

*Primary Examiner* — Shouxiang Hu

(74) *Attorney, Agent, or Firm* — Oblon, Spivak, McClelland, Maier & Neustadt, L.L.P.

(57) ABSTRACT

A solid-state image pickup device includes a solid-state image sensor chip having a solid-state image sensor having a photosensitive element formed on a main surface of a semiconductor substrate and chip electrodes led to the back surface of the semiconductor substrate, a passive chip bonded on the back surface of the solid-state image sensor chips having passive parts mounted in its thickness and electrically connected to the chip electrodes of the solid-state image sensors. The device further includes a lens holder fixed to enclose the photosensitive element of the solid-state image pickup sensor chip and a lens barrel to fit into the lens holders, wherein the passive chip is formed having a size equal to or smaller than a size of the solid-state image sensors.

3 Claims, 9 Drawing Sheets

(56) References Cited

U.S. PATENT DOCUMENTS

| | | |
|---|---|---|
| 2004/0075761 A1 | 4/2004 | Maeda et al. |
| 2005/0116142 A1 | 6/2005 | Mok et al. |
| 2005/0163016 A1 | 7/2005 | Kimura |
| 2006/0002097 A1 | 1/2006 | Borland et al. |
| 2006/0014327 A1 | 1/2006 | Cho et al. |
| 2006/0023109 A1 | 2/2006 | Mabuchi et al. |

FOREIGN PATENT DOCUMENTS

| | | |
|---|---|---|
| JP | 2003-158214 | 5/2003 |
| JP | 2004-63751 | 2/2004 |
| JP | 2004-88082 | 3/2004 |
| JP | 2005-216970 | 8/2005 |
| JP | 2005-317903 | 11/2005 |
| JP | 2006-5211 | 1/2006 |
| JP | 2006-13332 | 1/2006 |
| KR | 10-2005-0077267 | 8/2005 |
| KR | 10-2006-005840 | 1/2006 |

OTHER PUBLICATIONS

Office Action issued Feb. 15, 2011 in Japan Application No. 2006-106246 (w/partial English translation).

U.S. Appl. No. 13/417,465, filed Mar. 12, 2012, Sekine.

* cited by examiner (a)

(b)

(c)

SOLID-STATE IMAGE PICKUP DEVICE AND A CAMERA MODULE

CROSS REFERENCE TO RELATED APPLICATIONS

This application is a division of and claims the benefit of priority under 35 U.S.C. §120 from U.S. Ser. No. 11/697,451 filed Apr. 6, 2007, and claims the benefit of priority from prior Japanese Patent Application No. 2006-106246 filed Apr. 7, 2006, the entire contents of each of which are incorporated herein by reference.

TECHNICAL BACKGROUND OF INVENTION

The present invention relates to a solid-state image pickup device, a solid-state image pickup device equipped with an optical lens (called as a camera module in the following description) and its manufacturing method.

The construction of a conventional camera module using such a solid-state image pickup device as a CCD image sensor, CMOS image sensor or the like will be described with reference to FIG. 1A and FIG. 1B. FIG. 1A is a perspective view of a camera module and FIG. 1B is its vertical cross-sectional view. As illustrated in these figures, a lens holder 1 is fixed stationary on a printed circuit board 2. The lens holder 1 is made of cylindrical section 1-1 and a square cylindrical section 1-2 that has a larger horizontal sectional area than the horizontal sectional area of this cylindrical section 1-1. On the side surface of the printed circuit board 2, electrode sections 3 are formed for an external connection. Inside of the cylindrical section 1-1 of the lens holder 1, a lens barrel 4 is inserted. The lens barrel 4 is screwed in the cylindrical section. That is, the outer periphery of the lens barrel 4 is threaded (not illustrated) and the inner periphery of the cylindrical section 1-1 of the lens holder 1 is threaded to engage with the thread of the lens barrel 4. Accordingly, the lens barrel 4 is moved vertically when the lens barrel 4 is rotated in the clockwise or counterclockwise direction in the cylindrical section 1-1 of the lens bolder 1. On the printed circuit board 2, a passive part 5 such as resistor, capacitor, etc. and a solid-state image sensor 6 are mounted. An electrode (not shown) of the solid-state image device 6 is connected to an electrode (not shown) of the printed circuit board by a bonding wire 7. The solid-state image sensor 6 is further connected to the passive part 5 (not shown). The printed circuit board 2 is connected to outside parts (not shown) through its electrode section 3. Passive part 5 is connected to a wiring section (not shown) of the circuit board normally by the reflow soldering. The reflow soldered section is shown by 5'.

In the lens holder 1, an optical filter 8 such as an infrared rays cutting filter is joined to the lens holder by a bonding agent 9. Inside of the lens barrel 4, an optical lens 10 is fixed. The lens barrel 4 is adjusted and fixed at a prescribed height in the cylindrical section 1-1 of the lens holder 1 by a screw. At the position of this prescribed height, an image taken by the optical lens 10 is formed on the sensing section (not shown) of the solid-state image sensor 6.

A method for manufacturing parts in the conventional camera module shown in FIG. 1A and FIG. 1B will be explained using FIG. 2 through FIG. 6. In the following description, the same elements as those shown in FIG. 1A and FIG. 1B are assigned with the same reference numerals. In the cylindrical lens barrel 4 shown in FIG. 2(a), the optical lens 10 is fixed as shown in FIG. 2(b). In the square cylindrical portion 1-2 of the lens holder 1 shown in FIG. 3(a), an optical filter 8 is fixed by a bonding agent and then, the lens barrel 4 is screwed in the lens holder 1 as shown in FIG. 3 (c).

FIG. 4 (a) through FIG. 4(e) show the module assembling processes. The passive part 5 is formed on the printed circuit board 2 (FIG. 4(a)) according to the reflow soldering method (FIG. 4(b)). After bonding the solid-state image sensor 6 on the printed circuit board 2, it is connect on the printed circuit board by a bonding wire 7 (FIG. 4(c)). Next, the lens holder 1 that was assembled as shown in FIG. 3 is bonded and fixed on the printed circuit board 2. Then, an image taken by the lens 10 is fixed at the position of image forming height of the solid-state image sensor. A camera module is thus formed (FIG. 4(e)).

Next, FIG. 5(a) through FIG. 5(e) show the cutting process of solid image pickup chips from a wafer of which semiconductor manufacturing process was completed. On a wafer 11 of which semiconductor manufacturing process was completed, a solid-state image sensor is formed on each of several chip areas 6' in the same area (FIG. 5(a)). The solid-state image sensor 6 is separated to respective chips by dicing the sensors 6' along the boundary lines 6" which divide respective chip areas 6'. Normally, prior to this dicing process, the electrical and optical tests of each solid-state image pickup chip are conducted (hereinafter, this is called as the wafer test) and an identification mark that is called as the bad mark (not shown) is attached to defective ships. At the center of the solid-state image sensor, a photosensitive area 13 in which pixels are arranged in a matrix is formed and a bonding pad 12 is arranged on the peripheral part of the chip (FIG. 5(b)). FIG. 5(c) shows the cross-section cut along a arrow line AA' of FIG. 5(b). As shown in FIG. 5(c), plural micro-lenses 14 are formed on the surface of the photosensitive area 11 at the center of the solid-state image sensor 6 corresponding to respective pixels. The micro-lenses 14 promote the sensitivity of the solid-state image sensor by increasing the focusing property to pixels of the solid-state image sensor.

In the conventional camera module manufacturing process, such problems as described below are normally generated.

1) As shown in FIG. 1B, since the passive part 5 is formed on the same printed circuit board 2 with the solid image sensor 6 in the camera module, the module size becomes inevitably larger than the size of the solid-state image sensor. This will be disadvantageous for the downsizing of modules.

2) As shown in FIG. 1B, several units of capacitor of 0.1 uF are needed as a passive part 5 for a camera module. For an ordinary capacitor of this capacity, its external dimension is 0.6×0.3×0.3 mm (called as 0603). In the case of ceramic capacitor in further small size 0.4×0.2×0.2 mm (called as 0603), its capacity is about 0.01 uF at present and therefore, number of capacitors arranged on a circuit board increases and module size becomes larger than the size using 0603 size ceramic capacitors.

Further, when capacitors are mounted on the surface of the circuit board 2 by the reflow soldering, it becomes necessary to adapt solder to the electrodes on the sides of capacitors and this will also be disadvantageous for the downsizing of module size.

3) As shown in FIG. 1B, in a camera module, the solid-state image sensor is connected to the wiring portion (not shown) of the circuit board normally by the bonding wire 7. It is necessary to provide a space of 0.2 to 0.3 mm for this bonding wire and this will also become disadvantage for the downsizing of module size.

4) As shown in the camera module manufacturing process in FIG. 4, the solid-state image sensor is formed on the printed circuit board after the passive part 5 is formed by the reflow soldering and the lens holder 1 is formed after the wire bonding of the solid-state image sensor. If dust is attached on the surface of the solid-state sensor at this time, a defect that is called as a black flaw is produced in an image taken by this camera module. One pixel size of the solid-state image sensor 1 is normally 2 to 5 μm. To prevent this adhesion of dust, it is necessary to manufacture the camera module with a manufacturing line in a clean room and a large facility investment is required. Also, it becomes necessary to provide a cleaning equipment for removing dust adhered to the solid-state image sensor. The dust removing method is largely restricted for the reason that the surface of the solid-state image sensor is rough as there are micro-lenses 14 formed thereon and the material used is acrylic resist that is weak in mechanical strength.

5) As shown in FIG. 5, in the dicing process of the solid-state image sensor cutting from the wafer 11 after the semiconductor manufacturing process is completed, a semiconductor (normally, called as Si) is cut with a rotary grinding stone of an equipment that is normally called as a dicer. In this cutting work, however, a large amount of Si cutting waste is produced. These Si waste is washed away by washing water in the dicing process. However, the waste is partially get into the surface of the micro-lens and not removed in the succeeding washing process and thus generates the black flaw on the surface of the camera module. The final judgement of this black flaw is the step after the assembling of camera modules and all component parts (the solid-state image sensor, outer part 5, lens holder 1, optical lens 10, optical filter 8 and printed circuit board 2) accompanied to camera modules will be wasted.

6) Deviation of the mounting position of the lens holder 1 to the circuit board 2, flaw of the optical lens 10, defective optical characteristic, flaw and deviation of optical characteristic of optical filters, dust adhered to the lens holder, flaw, deviation of optical characteristic in the camera module manufacturing process are finally judged in the camera module test. Thus, if defects are determined at this stage, all component parts associated to the camera modules will be wasted.

Accordingly, it is an object of the present invention to provide camera modules that are small in size and easy to manufacture and to provide a manufacturing method thereof.

SUMMARY OF THE INVENTION

According to an embodiment of the present invention, a solid-state image sensor is provided. This solid-state image sensor includes a solid-state image sensor chip having a solid-state image sensor including a photosensitive element formed on a main surface of a semiconductor substrate and chip electrodes led to the back surface of the semiconductor substrate, and a passive chip bonded on the back surface of the solid-state image sensor chips having passive parts mounted in its thickness and electrically connected to the chip electrodes of the solid-state image sensors, wherein the passive chip is formed having a size equal to or smaller than a size of the solid-state image sensors.

According to another embodiment of the present invention, a camera module is provided. The camera module includes a solid-state image sensor chip having a solid-state image sensor including a photosensitive element formed on a main surface of a semiconductor substrate and chip electrodes led to the back surface of the semiconductor substrate, a passive chip bonded on the back surface of the solid-state image sensor chips having passive parts mounted in its thickness and electrically connected to the chip electrodes of the solid-state image sensors, a lens holder fixed to enclose the photosensitive element of the solid-state image pickup sensor chip, and lens barrels to fit into the lens holders, wherein the passive chip is formed having a size equal to or smaller than a size of the solid-state image sensors.

Further, according to another embodiment of the present invention, a method for manufacturing a camera module is provided including steps of;

forming passive components and a wiring section for connecting the passive components with each other in a plurality of chip areas on the main surface of the first semiconductor wafer respectively, forming a first lead-through electrode at a peripheral part of each of the chip areas, to which the wiring section in each chip area is connected, forming a solid-state image sensor in the plural number of chip areas on the main surface of the second semiconductor wafer respectively and pads connected to the solid-state image sensors at a peripheral part of each of the chip areas, forming a second lead-through electrode that is connected to the pads at the peripheral parts of each of the chip areas, bonding the second semiconductor wafer on the main surface of the first semiconductor wafer by aligning the first and the second lead-through electrodes formed in each of the chip areas so as to contact with each other, forming a dam-shaped spacer at the peripheral part of each of the chip areas of the second semiconductor wafer, fixing an optical filter on the dam-shaped spacer formed at the peripheral part of each of the chip areas, fixing a lens holder on the optical filter in each of the chip areas, and cutting and separating the first and the second semiconductor wafers laminated and fixed to each other for every chip area.

DETAILED DESCRIPTION OF THE INVENTION

Embodiments of the present invention will be described with reference to the accompanying drawings. It should be noted that the drawings are schematic ones and the dimension ratios shown herein are different from the actual ones. The dimensions vary from drawing to drawing and so do the ratios of dimensions. The following embodiments are directed to a device and a method for embodying the technical concept of the present invention and the technical concept does not specify the material, shape, structure or configuration of components of the present invention. Various changes and modifications can be made to the technical concept without departing from the scope of the claimed invention.

Embodiment 1

Figure 1A:
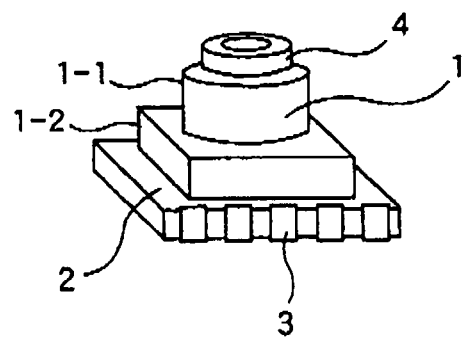
FIG. 1A is a perspective view showing a structure of a conventional camera module.
Figure 6:
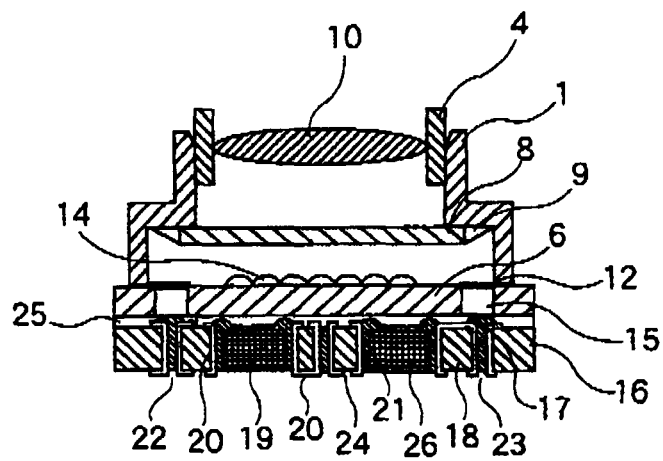
FIG. 6 is a cross-sectional view of a camera module used in the embodiment of the present invention.
Figure 7:
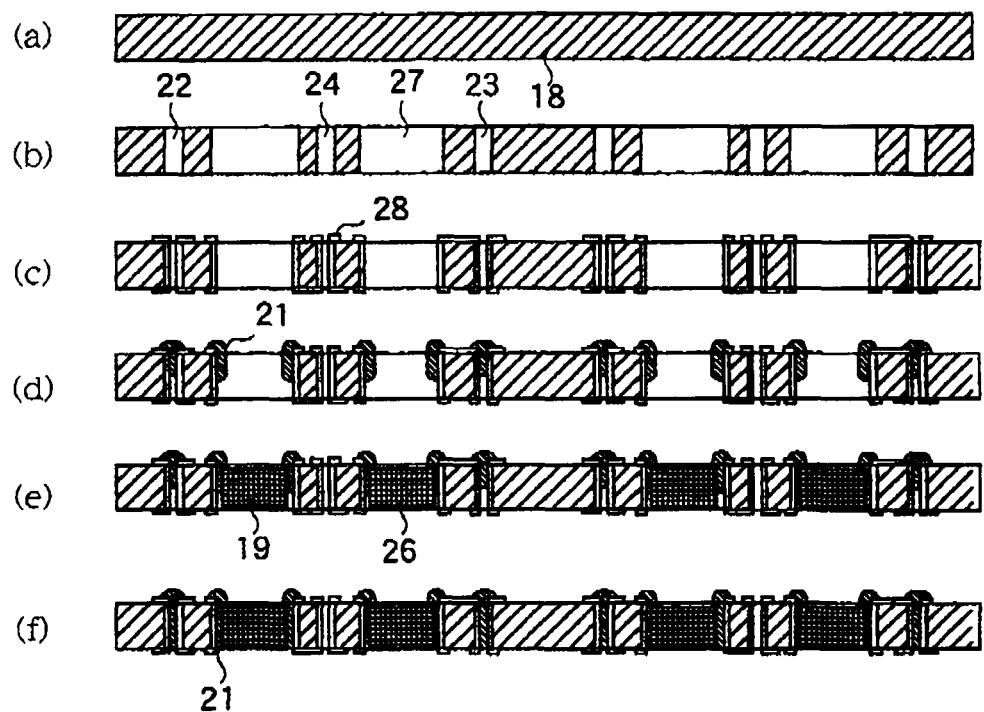
FIG. 7 shows diagrams for explaining the manufacturing process of a passive chip that is used in a camera module used in the embodiment of the present invention.

FIG. 6 is a cross-sectional view of a camera module according to a first embodiment of the present invention and FIG. 7 shows diagrams for explaining the manufacturing process of the passive chip that is used in the camera module shown in FIG. 6. A lens holder 1 shown in FIG. 6 has a same structure as that of a conventional lens holder 1 shown in FIG. 1A and FIG. 1B and therefore, corresponding components will be assigned with the same reference numerals and the detailed explanation thereof will be omitted. In the sensing area of the solid-state image sensor 6, micro-lenses 14 are provided. Under the bonding pad 12, the lead-through electrodes 15 are formed and connected to the electrode sections 17 of the passive chip 16. The passive chip 16 is composed of the printed circuit board 18. On the printed circuit board 18, a hollow portion is provided and a capacitor 19 is inserted into it. The wiring portion of the printed circuit board 18 is shown by 20. The electrical connection of the capacitor 19 with the wiring portion 20 is made by a solder 21 as well as fixing the capacitor 19 to the circuit board 18. Three kinds of through-holes 22, 23 and 24 are formed on the printed circuit board 18. The first kind of through hole 22 is a type of leading the electrode of the solid-state image sensor to the lead-out electrode at the back side of the passive chip of the solid-state image sensor. The second kind of through-hole 23 is a type of leading the electrode of the solid-state image sensor to the back side of the passive chip and to connect it to the capacitor 19. The third kind of through-hole 24 is a type of leading the wiring 20 from the capacitor 1 to the back side of the passive chip. In addition to the capacitor 19, a resistor 26 may be inserted into the hollow portion of the printed circuit board 18. The passive chip 16 and the solid-state image sensor are connected using an anisotropy conductive paste 25, with being pressed and made conductive. The anisotropy conductive paste is a paste in which electric resistance drops in the direction of pressure applied. Normally, in the paste, metallic fine particles are uniformly distributed and are coupled along the direction of the pressure applied thereby reducing resistance.

In FIG. 7, (a) through (f) are diagrams for explaining a method for manufacturing the passive chip 16. The through-holes 22, 23, 24 and the hollow portion 27 are provided (FIG. 7(b)) in a base material 18 of the printed circuit board (FIG. 7(a) and the wiring pattern 28 is printed along the edge portion (FIG. 7(c)). Then, a creamy solder is printed (FIG. 7(d)) and the capacitor 19 and resistance 26 that are the passive parts are inserted into the hollow portion 27 (FIG. 7(e)). Lastly, the printed circuit board is exposed to a reflow temperature of solder to get the solder molten (FIG. 7(f)).

Embodiment 2

Figure 8:
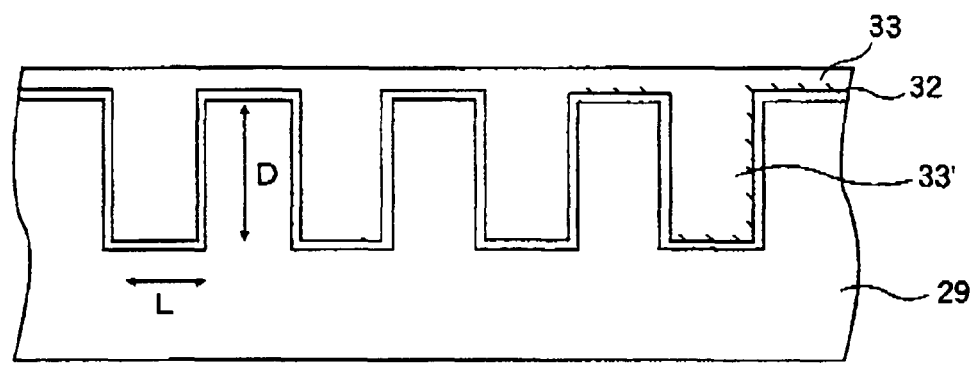
FIG. 8 is a cross-sectional view showing an essential part of a passive chip used in a camera module according to another embodiment of the present invention.
Figure 9:
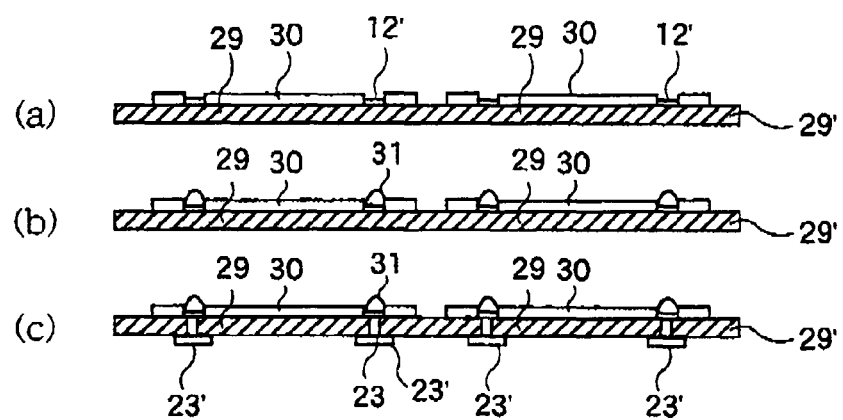
FIG. 9 shows diagrams for explaining a assembling process of passive chips used in a camera module according to the embodiment of the present invention.

FIG. 8 and FIG. 9 are the cross-sectional diagrams showing the structure of a capacitor that is an passive chip used in the second embodiment of the present invention. FIG. 8 shows a structure of a capacitor that is an example of the passive chip. As shown in FIG. 8, the capacitor in the passive chip has a structure, in which a gate electrode 33 is provided on the main surface of a semiconductor board 29 having a conductivity type through a gate insulating membrane 32. In this case, it becomes possible to make an area opposing to the gate electrode membrane wide and increase the capacitance of the capacitor by regularly digging deep grooves 33' on the surface portion of the semiconductor substrate 29. Capacitors having such the structure are normally called as capacitors of a trench structure. The capacitance Cox of the oxidized membrane of the capacitor having such a MOS structure is expressed below:

$$Cox = Cox = \in ox * \in o * L * YV/tox \qquad (1)$$

Where $\in ox$ is a dielectric constant of the oxidized membrane of 3.9, $\in o$ is the dielectric constant in vacuum of 8.86E-14 F/cm, L is a width of the capacitor, W is the length of the capacitor, and tox is the thickness of the oxidized membrane.

According to this formula, in the case of 2 mm square capacitor having a gate oxidized membrane of 75 angstrom (A) for example, Cox is 0.018 µF in the structure without the trench. While Cox is 0.1 µF when D/L is 5 in the trench structure shown in FIG. 8, which enables to provide a maximum capacitor of 0.1 µF that is used in a typical camera module. Three to four units of the capacitors are used and the capacitor area may be about 4 mm square. However, this area is nearly equal to the chip size of a VGA (Video Graphic Array) type CMOS sensor. Resistance is formed with two units of resistor each having 5 ohm by diffusing impurities in the same chips, thereby not increasing the chip size.

Figure 5:
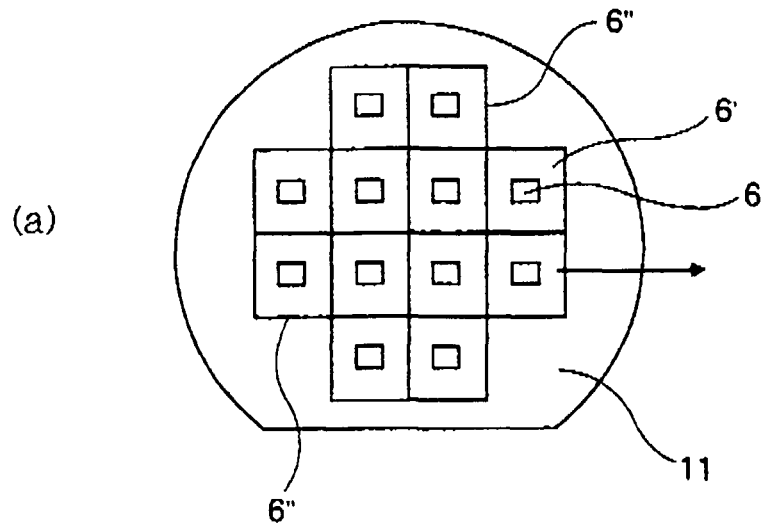
FIG. 5 shows diagrams for explaining a conventional process to cut off solid image sensor from a wafer.
Figure 5:
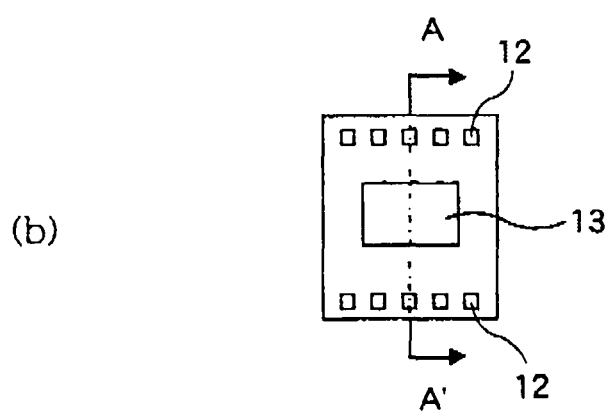
Figure 5:
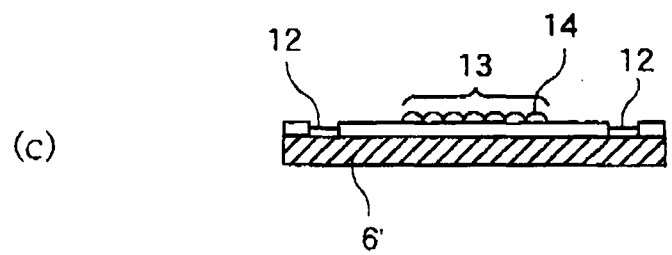

FIG. 9 shows the additional manufacturing process of passive chips that are used in modules. As shown in FIG. 9(a), a plurality of passive chips 29 are formed on the main surface of a semiconductor wafer 29' (hereinafter, referred to as a first semiconductor wafer). In each of the passive chips 29, passive parts (capacitor, resistor) 30 is formed. Further, the passive chip 29 is formed in a size almost equal to the chip size of the above-mentioned solid-state imaging sensor 6' shown in FIG. 5. A bonding pad 12' is formed at a portion f each passive part 30 where an electrode is formed. Capacitors can be classified into good or defective product groups by this pad. That is, a capacitor included in each passive part 30 is tested and the bonding pad 12' is formed on good passive chips only while the wiring of defective capacitor is cut off. As described above, since a capacitor having a large capacity occupies a large area, deterioration of yields is feared. As a countermeasure, a design having a redundancy is desirably adopted. In the design, a capacitors are divided into certain blocks, which are classified into good or defective groups by testing. Wiring portions connected to those blocks classified into the defective group are cutt off. The yield of passive chips can be increased to nearly 100% by making the dividing size of capacitors reasonable.

There is a fear that, in a MOS capacitor, the depletion layer is produced in addition to the above-mentioned oxidizing membrane capacity by the voltage applied to the gate electrodes and the entire capacity may drop. However, the capacitor of camera module is normally applied with plus potential only and thus only the oxidizing membrane capacity is provided by using a N type semiconductor substrate, thereby stabilizing the characteristic of the capacitor.

Nextly, a bump is formed on a bonding pad 12'. This bump can be a metal wire stud bump or a bump formed in a plating process (FIG. 9(b)). Then, a through-hole 23 is formed by removing the semiconductor portion under the bonding pad 12' by the laser and a first lead-through electrode 23' is formed by burying an electrode material (FIG. 9(c)). The lower edge of this first lead-through electrode 23' is connected to a lead-out electrode 23" of a camera module that is formed along the lower surface of each passive chip 29.

Figure 10:
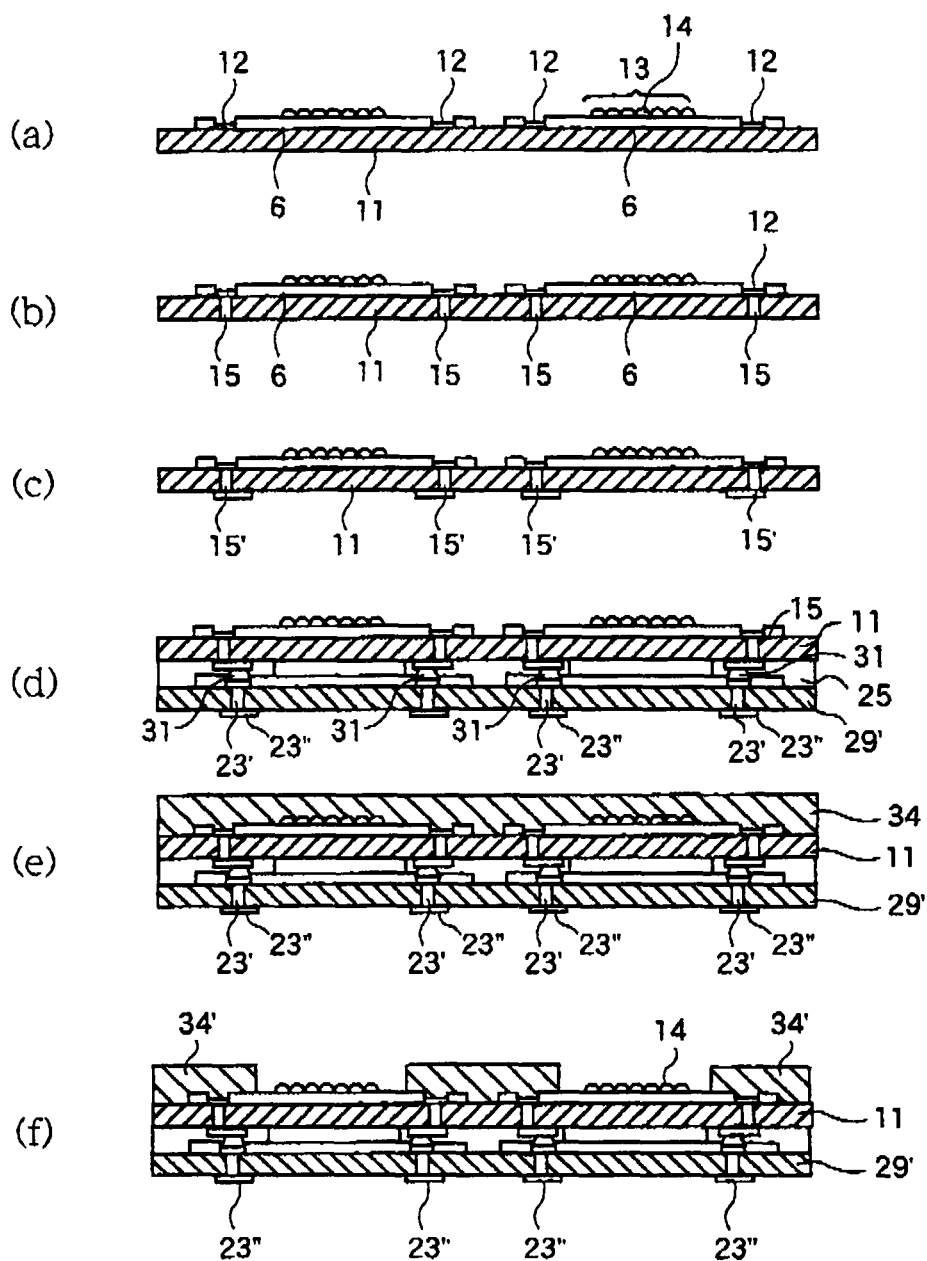
FIG. 10 shows diagrams for explaining a assembling process of passive chips used in a camera module according to another embodiment of the present invention.
Figure 11:
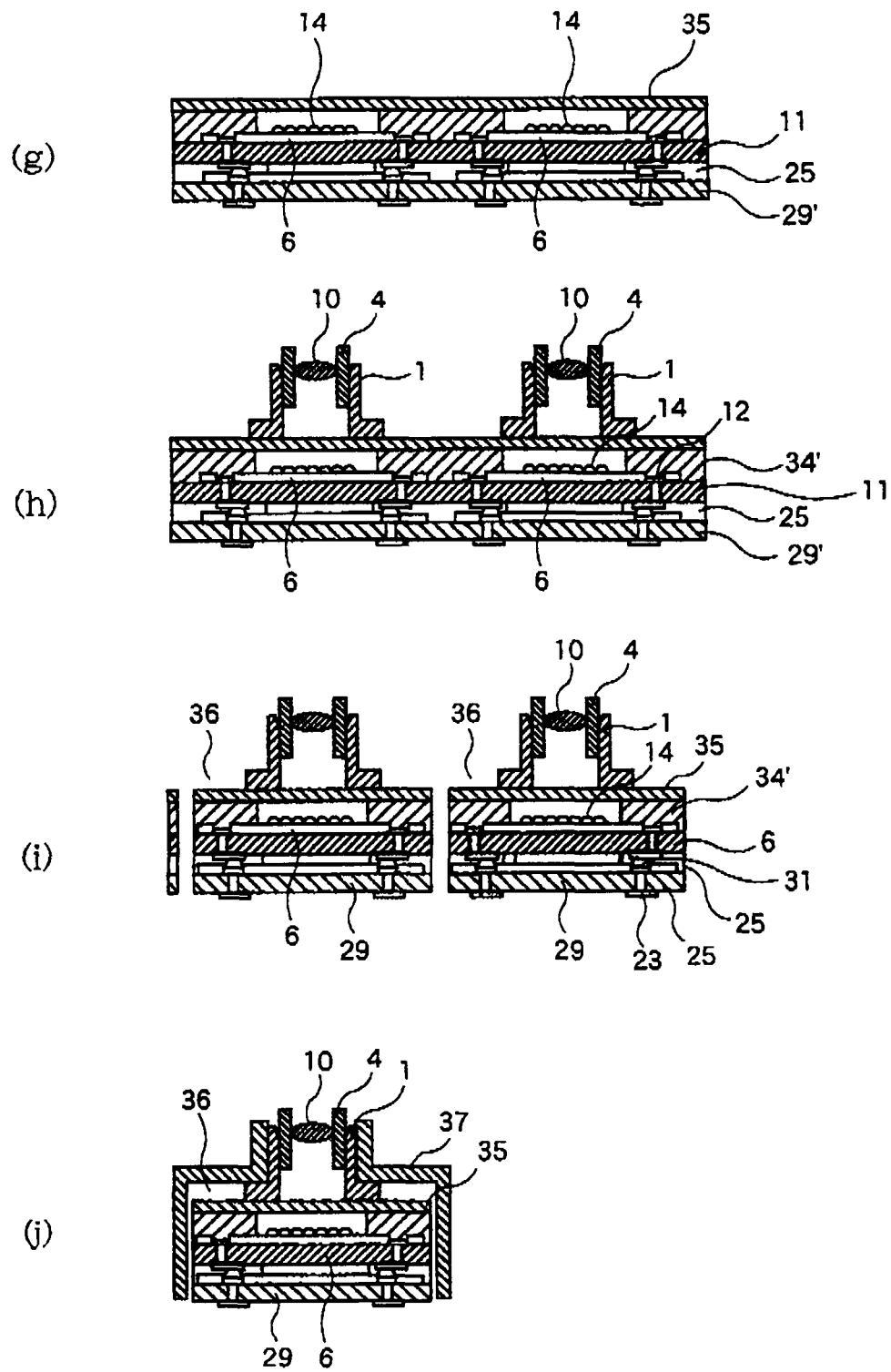
FIG. 11 shows diagrams for explaining the remaining part of the manufacturing process for the passive chip shown in FIG. 10.

FIG. 10 and FIG. 11 are diagrams for explaining the manufacturing process of modules using a first semiconductor wafer 29' on which plural number of passive ships 29 are formed as shown in FIG. 9. The semiconductor wafer 11 composed of plural chips with solid-state image sensor formed on the main surface (hereinafter, referred to as the second semiconductor wafer) is subject to testing in the wafer state with respect to each of the plural chips to find positions where good chips are formed (FIG. 10(a)). Then, an electrode hole 15 is formed by removing the semiconductor portion below the bonding pad 12 (FIG. 10(b)). A second lead-through electrode 15' is formed by filling conductive material in the electrode hole below the boding pad (FIG. 10(c)). Thereafter, the first semiconductor wafer 29' (shown in FIG. 9(c)) is arranged on the back surface of the second semiconductor wafer 11. Then, the bump portion 31 of the passive chip 29 formed on the first semiconductor wafer 29' and the lead-through electrode 15' of the solid-state imaging sensor 6 formed on the second semiconductor wafer 11 are bonded by an anisotropic conductive paste 25. As described above, at this time, the solid-state imaging sensor 6 and the passive chip 29 should have the same chip size (FIG. 10 (d)).

Then, the main front surface of the second semiconductor wafer 11 is coated with a spacer resin 34 (FIG. 10(e)). For this spacer resin, a photosensitive resin made by Sumitomo Bakelite is used. When the coated spacer resin 34 is exposed a light and is developed, only portions of the resin exposed to a light is removed while the micro-lens 14 are maintained in their shape, thereby forming a spacer resin 34' in the dam shape around each solid-state imaging sensor 6 FIG. 10(f)). This dam shape spacer resin 34' is desirably 20 to 40 µm thick. The upper surface of this dam shape spacer resin 34' is coated with a bonding agent, on which an optical filer 35 like an IR cut filter is bonded and fixed. Here, due to the dam shape spacer resin 34' provided, a space is formed between the micro-lens 14 of the solid-state image sensor and the optical filter 35 (FIG. 11(g)).

Figure 3:
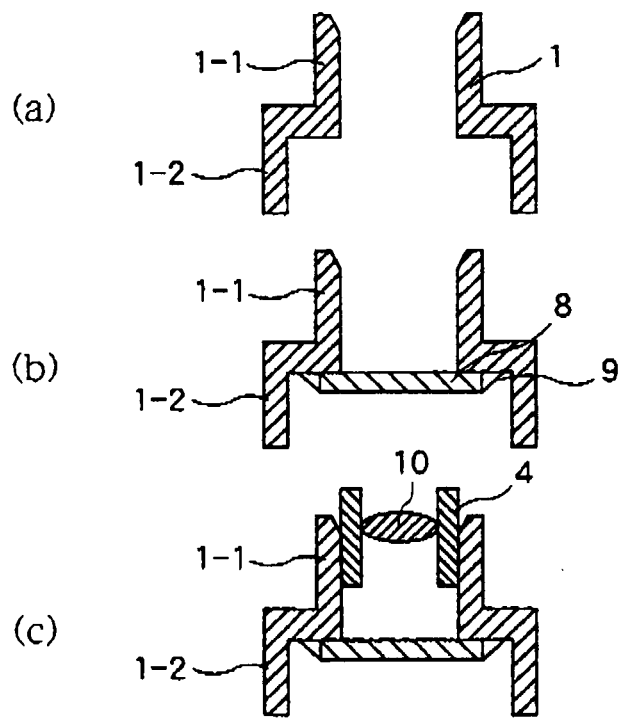
FIG. 3 shows diagrams for explaining a manufacturing process of a conventional lens holder.
Figure 4:
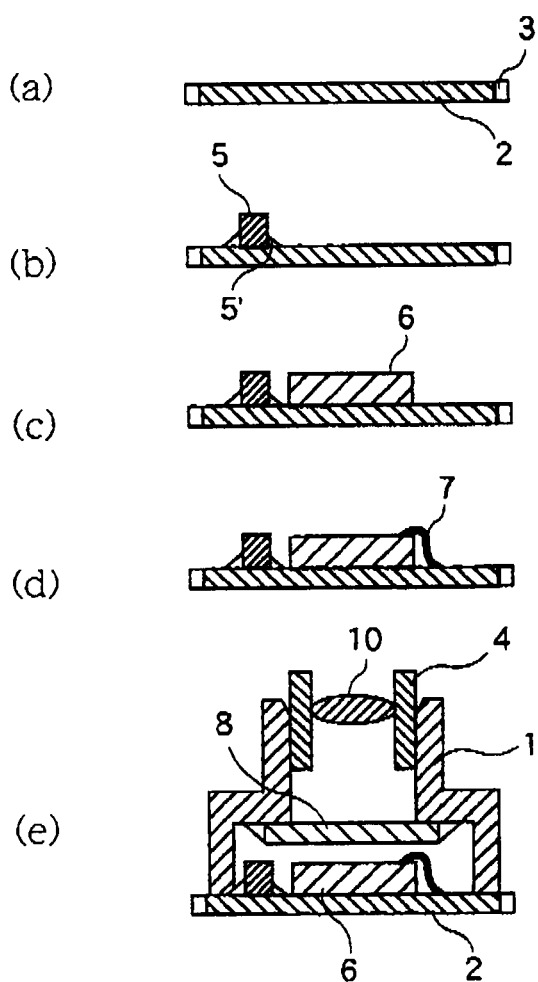
FIG. 4 shows diagrams for explaining a manufacturing process of a conventional camera module.

Further, the lens holder 1 is installed on the optical filter 35. In this case, the bonding process of the optical glass shown in FIG. 3(b) is not needed for the lens holder (FIG. 11(h)).

In the processes described above, the solid-state image sensor can be manufactured at a wafer base as a manufacturing unit using the first semiconductor wafer 29' and the second semiconductor wafer 11. The first semiconductor wafer 29' and the second semiconductor wafer 11 integrated into one unit are cut along the dicing line into chips. At this time, the camera module 36 is formed by cutting the optical filter 35, the dam shape spacer resin 34' and the anisotropic conductive paste 25 together (FIG. 11(i)).

In the camera module 36 thus constructed, the solid-state image sensor and the passive chip 29 are connected jointly by the second lead-through electrode 23' and the lead-out electrode 23" connected o the second lead-through electrode 23' are formed on the lower surface of the passive chip 29 as shown in FIG. 11 (i). This camera module 36 is provided with the optical filter 35 and the lens holder 1. The passive chip 29 and the solid-state image sensor 6 are bonded with the anisotropic conductive paste 25. The solid-state image sensor 6 and the optical filer 35 are bonded with the spacer resin. Thus, the spaces between the passive chip 29 and the solid-state image sensor 6 and between the solid-state image sensor 6 and the optical filer 35 are maintain in the sealed state. This structure includes all components of an ordinary camera module shown in FIG. 1B and, therefore, all that is needed is to test the individual chip after it is diced.

However, there is a fear that a part of the incident light may transmits through the optical filter 35 and the dam shape spacer resin 34' leaking into the solid-state image sensor. As a countermeasure, this defect can be solved by covering the outer surface of the camera module with a light shielding cover 37. More simply, a black shielding paint is blown over the camera module with the lens 10 covered in the process shown in FIG. 11(h) or FIG. 11(i), and the cover is removing after the paint is dried, so that the camera module 36 may be covered by a black paint.

Figure 1B:
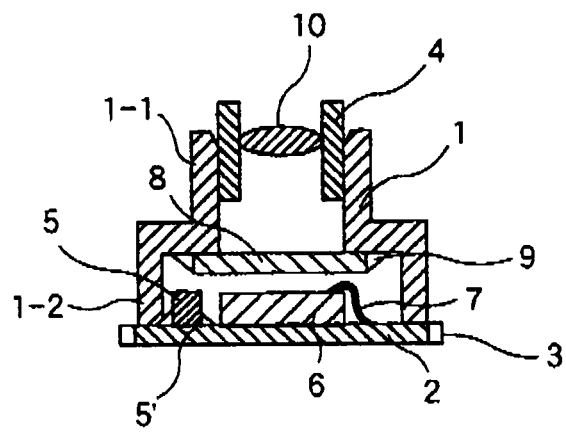
FIG. 1B is a cross-sectional view showing a structure of the conventional camera module.
Figure 2:
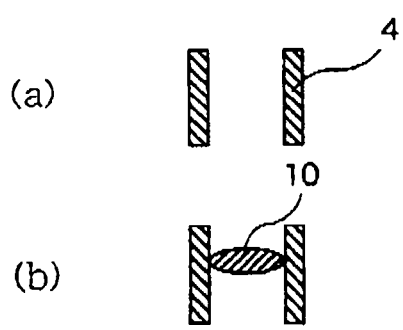
FIG. 2 shows diagrams for explaining a manufacturing process of a conventional lens barrel.

The camera module completed in the manner as described above can be tested according to the conventional camera module testing method shown in FIG. 1B.

In the next, there is a fear that gas may come out from the resin in the manufacturing process described above. However, there will be no problem because the through-holes 23, 15 for the lead-through electrodes in the structure according to the embodiment shown above provide an escaping way for the output gas. That is, in the state where no electrode material is filled in the through-holes 23, 15, the hollows of the through-holes 23, 15 blocked only by metallic layers 12' and 12 of the bonding pad portion. If gas was generated, these metallic layers 12' and 12 are easily broken and gas is discharged outside. When the lead-through electrode portion used for discharging the gas is shielded in the final process, a module kept air-tight is completed.

In the method for manufacturing the camera module of the present invention shown in FIG. 10 and FIG. 11, the test for the camera modules are conducted at the stage shown in FIG. 11(i) through FIG. 11 (j) after cutting the semiconductor wafer along the dicing line. However, when the test system is capable of contacting electrodes through the back surface of wafer, the test in the wafer state is possible at the stage shown in FIG. 11(g) through FIG. 11(h).

Embodiment 3

Figure 12:
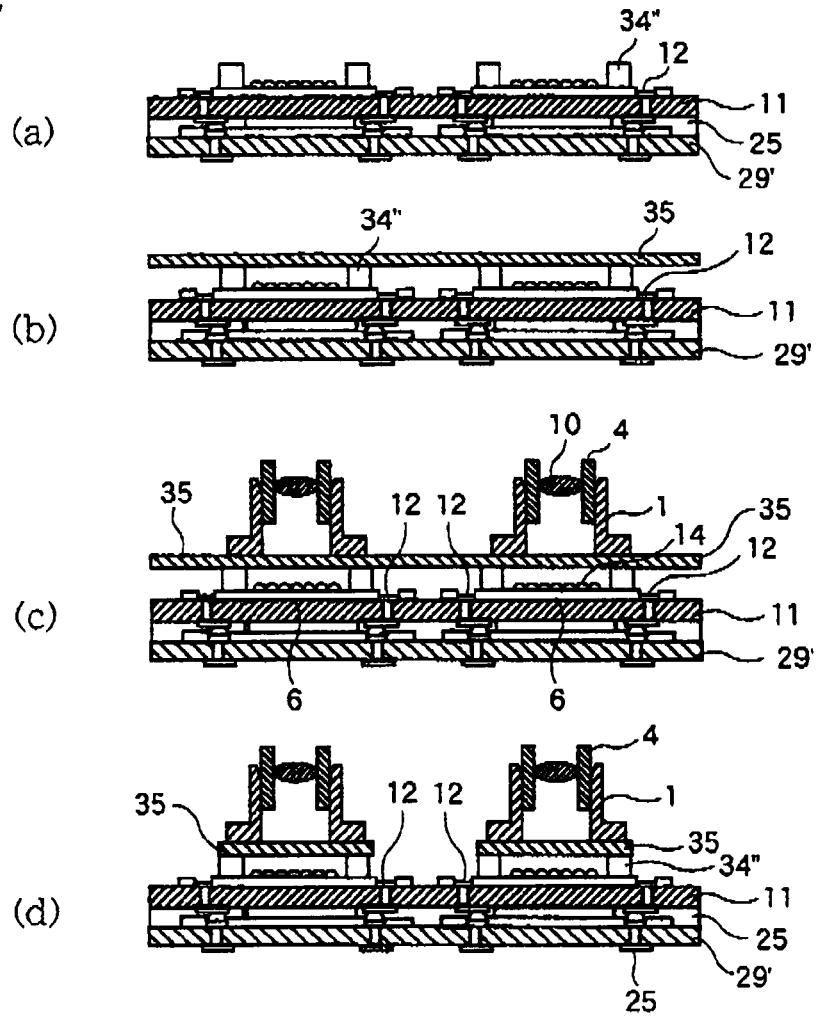
FIG. 12 shows diagrams for explaining the remaining part of the manufacturing process for the passive chip according to yet another embodiment of the present invention.

FIG. 12 shows a process for manufacturing a module adapted to a system for measuring a circuit voltage by having a probe contact to an electrode from the top of semiconductor wafers. This manufacturing method is substantially the same as that shown in FIG. 10 and FIG. 11 except that the spacer resin 34" is so coated as not overlapping with the bonding pad (FIG. 12(a)). The optical filter 35 is formed on the spacer resin 35 (FIG. 12(b)) and the lens holder 1 is formed only on the good chip on which the solid-state image sensor (FIG. 12(c)) is formed. This optical filter 35 can be removed from the intermediate region between the bonding pad 12 and 12 of the adjacent solid image sensor 6 and 6 (FIG. 12(d)). In this structure, it is possible to have a probe directly contact to the top of the bonding pad 12 where the light incidents. If it is possible to test the modules in the wafer state, it becomes also possible to make the focus adjustment of the lens in the wafer state.

That is, in this manufacturing method, the lens holder 1 can be bonded by confirming the position of the lens holder 1 to the photosensitive region 13, because it is possible to bond the lens holder 1 while the wafer testing in the state shown in FIG. 12(*d*). Further, if the optical lens 10 or the lens holder 1 was defective for an optical module, it is possible to replace the lens holder 1 with another good lens holder for retesting and fixing before bonding for fixing.

The optical filter 35 can be of injection molded plastic material. In this case, the filter is formed in advance by covering the photosensitive area 13 only without covering the bonding pad 12 and the dicing line. Then, hooking up the optical filter 35 with a peripheral flame (not shown) by a fishing pin and cut off this fishing pin at the time of dicing. Thus, the structure shown in FIG. 12(*d*) can be realized.

The optical filter 35 is supported by the spacer resin 34" and a space is formed between the filter 35 and the micro-lens of the solid-state image sensor. As a result, the lens effect of the micro-lens 14 will not be impaired. The optical filter 35 can be a infrared rays cut filter or a low-pass filter for suppressing the optical moire or a combination of them.

Embodiment 4

Figure 13:
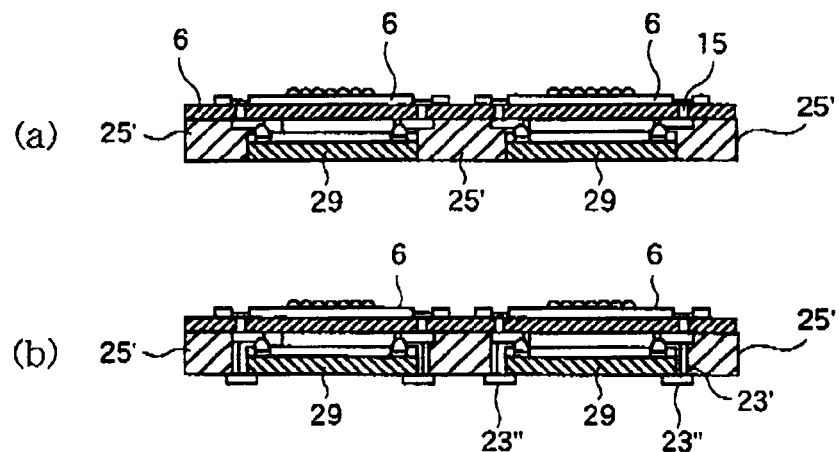
FIG. 13 shows diagrams for explaining the remaining part of the manufacturing process for the passive chip according to yet other embodiment of the present invention.

FIG. 13 shows a method for manufacturing the camera module according to yet other embodiment of the present invention. A method for manufacturing a module by pasting the passive chips 16 or 29 to the solid-state image sensor 6 has been explained, wherein the passive chips 16 or 29 has the same size as the solid-state image sensor 6. However, the passive chips 16 or 29 and the solid-state image sensor 6 may not necessarily be in the same size.

In this embodiment, after the process shown in FIG. 10(*c*), a passive chip 29 having a smaller size than that of the solid-state image sensor 6, which is separated into a piece in advance, is pasted on the back side of a good chip of the solid-state image sensor (FIG. 13(*a*)). In this diagram, the anisotropic conductive paste 25' is coated with the same thickness as the passive chip 29 but it is sufficient if the anisotropic conductive paste 25' is coated on the bump portion only and the other components may be buried in resin. Through-holes are provided on the anisotropic conductive past 25' and an electrode 23' and a lead-out electrode 23" are formed (FIG. 13(*b*)). This is also applicable when the passive chip 16 is pasted to the solid-state image sensor and the passive chip 16 may be pasted after being separated into a piece.

The present invention is not limited to the embodiments described above but can be modified variously. For example, although the lens holder 1 was arranged on the optical filter 35 in Embodiments 1 and 2, it may be fixed directly on the surface of the solid-state image sensor 6.

Further, although the optical filer 35 was formed on the dam-shape spacer resin 34, it may be formed in the lens holder 1 and a transparent plate may be formed on the spacer resin 34 instead of an optical filer.

Further, although the bonding pad portion is exposed after the optical filter 35 was bonded and formed on the whole surface of the wafer in Embodiment 3, as shown in FIG. 12(*b*)-(*d*), the process of FIG. 12 (*c*) may be omitted and jamped from the process FIG. 12(*b*) to FIG. 12 (*d*) by forming the optical filter 35 on the portion other than the bonding pad portion.

According to the embodiments of the present invention described above, the following various advantages are obtained.

(1) Because passive parts are arranged on the back side of the solid-state image sensor and the lead-through electrode is used for a leading out electrode without using a bonding wire, camera modules can be downsized to the same size of the solid-state image sensor.

(2) There is the photosensitive portion of the solid-state image sensor at the focusing position of the lens surface as conventional. However, the module becomes thin by the thickness of the printed circuit board (normally 0.3 mm-0.6 mm) because the module has no printed circuit board conventionally used. Although the thickness of the passive chip is added, it is normally possible to make the wafer thickness to be as thin as about 100 μm because a lead-through electrode is applied to the wafer. Accordingly, the module in which passive parts is composed by a semiconductor chip becomes further thinner by about 0.2 mm to 0.5 mm than the conventional one being close to the limit of the module size.

(3) The manufacturing process is hardly affected by the influence of dust generated in the assembling process of image sensors by forming a transparent board like the optical filter 35 covering the photosensitive area at the early assembling stage of the solid-state image sensor. In particular, the adhesion of Si waste generated in the dicing of the wafers after the completion of semiconductor final process to the photosensitive area can be prevented by covering the photosensitive area with the spacer resin, optical filter, lens holder and optical lens. Further, for the same reason, adhesion of dust in the assembling process can be prevented and the yield of solid-state image sensors can be promoted.

(4) In such a type solid-state image sensor which is assembled in wafer states with the bonding pad exposed on the top surface, the module test can be made at the stage of the wafer processing. Using a lens holder with a lens 10 fixed directly to the lens holder 1 instead of the conventional structure wherein the lens level 4 moves in the lens holder 1, it is possible to focus without moving the lens in the lens holder 1 in the wafer state by changing the pressing degree of the lens holder while monitoring the focus signal of the solid-state image sensor. This allows to repair a defective lens during the assembling process and realize the effective use of parts as well as reduction of manhour. It is a large advantage for promoting the full automation of the module test.

(5) The assembling of modules in the wafer state brings many advantages in addition to those described above. First, the location of the solid-state image sensor chips are recognized accurately in the wafer state. As a result, the assembling can be realized more accurately and with higher throughput by cooperating with an automatic mounting machine of the lens holder. That is, it was necessary to judge a chip position to adjust the position of the lens holder based on the chip position judged in a conventional optical module assembling system. While in the embodiment of the present invention, all the chip positions are readily known in the wafer state and lens holders can be mounted automatically at the position of every solid-state image sensor 6 in a wafer when a chip position in a wafer is once determined, thereby saving a process for judging the chip positions.

(6) In the conventional process after sealing the photosensitive area with a transparent plate using bonding agent, the adhesion of dust to the surface of the optical filter or transparent plate has been a problem. However, according to the embodiments of the present invention, there is provided a distance determined by the thickness of the transparent plate and of the bonding agent between the optical filter of a transparent plate and the photosensitive area. Therefore, images of the dusts is unfocussed on the photosensitive area because they are on the way of the light path for focusing by the lens.

Accordingly, the influence to black flaws can be greatly reduced when compared with dusts put on the photosensitive area of conventional solid-state image sensor.

(7) Because the wafer test can be made after sealing the photosensitive area with the transparent plate using bonding agent, the deterioration of assembling yield due to the dusts adhered on a transparent plate can be prevented. Thus, loss of lens holders, printed circuit board in the camera modules completed can be decreased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A camera module comprising:
a solid-state image sensor chip having a solid-state image sensor including a photosensitive element formed on a main surface of a first semiconductor substrate and backside chip electrodes extending from the main surface to the back surface of the first semiconductor substrate;
a passive chip bonded on the back surface of the solid-state image sensor chip electrically connected to the backside chip electrodes of the solid-state image sensor chip;
a lens holder fixed to enclose the photosensitive element of the solid-state image sensor chip; and
a lens barrel to fit into the lens holder;
wherein the passive chip comprises;
a second semiconductor substrate;
a passive component formed on a main surface of the second semiconductor substrate;
a wiring circuit formed on the main surface of the second semiconductor substrate for electrically connecting at least one of the backside chip electrodes of the solid-state image sensor chip to the passive component of the passive chip; and
a lead-through electrode in the passive chip for connecting one of the backside chip electrodes of the solid-state image sensor chip to an external connecting terminal on a back surface of the passive chip, and
wherein the passive chip is formed having a size equal to or smaller than a size of the solid-state image sensor chip,
wherein the passive component is a capacitor comprising:
a trench groove formed on the main surface of the second semiconductor substrate;
an oxidized membrane formed on the main surface of the second semiconductor substrate including the trench groove and an electrode formed thereon.

2. A camera module according to claim 1, wherein the solid-state image sensor chip further comprises:
a dam-shape spacer formed on a portion other than the photosensitive element on the main surface of the first semiconductor substrate; and
an optical filter fixed on the dam-shape spacer;
wherein the lens holder is fixed on the optical filer.

3. A camera module according to claim 2, wherein the outer surfaces of each of the lens holder, the solid-state image sensor chips, and the passive chip are provided with a light shielding cover or are coated with the light shielding paint, so that stray light other than the light passing through the lens may not come into the solid-state image sensor.

* * * * *